(12) United States Patent
Shen et al.

(10) Patent No.: US 7,923,842 B2
(45) Date of Patent: Apr. 12, 2011

(54) GAAS INTEGRATED CIRCUIT DEVICE AND METHOD OF ATTACHING SAME

(75) Inventors: Hong Shen, Camarillo, CA (US); Ravi Ramanathan, Thousand Oaks, CA (US); Qiuliang Luo, Moorpark, CA (US); Robert W Warren, Newport Beach, CA (US); Usama K Abdali, Aliso Viejo, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 91 days.

(21) Appl. No.: 11/377,690

(22) Filed: Mar. 16, 2006

(65) Prior Publication Data

US 2007/0215897 A1 Sep. 20, 2007

(51) Int. Cl.
*H01L 23/48* (2006.01)
(52) U.S. Cl. .......... 257/774; 257/E23.011; 257/E23.067
(58) Field of Classification Search .................... 257/103
See application file for complete search history.

(56) References Cited

U.S. PATENT DOCUMENTS

| | | | |
|---|---|---|---|
| 6,431,432 B1 | 8/2002 | McCormick et al. | |
| 6,492,269 B1 | 12/2002 | Liu et al. | |
| 6,495,019 B1 | 12/2002 | Filas et al. | |
| 6,596,635 B1 | 7/2003 | Tiku et al. | |
| 6,870,243 B2 | 3/2005 | Elliott et al. | |
| 6,982,441 B2 * | 1/2006 | Yamaki et al. | 257/192 |
| 2002/0048889 A1 * | 4/2002 | Hayama et al. | 438/304 |
| 2002/0093101 A1 | 7/2002 | Iyer et al. | |
| 2003/0015721 A1 * | 1/2003 | Slater et al. | 257/99 |
| 2003/0020174 A1 * | 1/2003 | Kohno | 257/774 |
| 2003/0141593 A1 | 7/2003 | Zuniga-Ortiz et al. | |
| 2004/0176053 A1 * | 9/2004 | Yamashita | 455/127.1 |
| 2005/0085084 A1 | 4/2005 | Chang et al. | |
| 2005/0127480 A1 | 6/2005 | Elliot et al. | |
| 2005/0157476 A1 | 7/2005 | Goudarzi | |
| 2007/0066054 A1 * | 3/2007 | Uzoh et al. | 438/652 |
| 2007/0210340 A1 * | 9/2007 | Zampardi et al. | 257/213 |

* cited by examiner

*Primary Examiner* — Quoc D Hoang
*Assistant Examiner* — Tony Tran
(74) *Attorney, Agent, or Firm* — Michael J. Tempel; Smith Frohwein Tempel Greenlee Blaha LLC

(57) ABSTRACT

A gallium arsenide (GaAs) integrated circuit device is provided. The GaAs circuit device has a GaAs substrate with a copper contact layer for making electrical ground contact with a pad of a target device. Although copper is known to detrimentally affect GaAS devices, the copper contact layer is isolated from the GaAs substrate using a barrier layer. The barrier layer may be, for example, a layer of nickel vanadium (NiV). This nickel vanadium (NiV) barrier protects the gallium arsenide substrate from the diffusion effects of the copper contact layer. An organic solder preservative may coat the exposed copper to reduce oxidation effects. In some cases, a gold or copper seed layer may be deposited on the GaAs substrate prior to depositing the copper contact layer.

13 Claims, 6 Drawing Sheets

GAAS INTEGRATED CIRCUIT DEVICE AND METHOD OF ATTACHING SAME

BACKGROUND

The field of the present invention is the design, fabrication, and manufacture of gallium arsenide (GaAs) integrated circuits. More particularly, the invention relates to an integrated circuit employing Gallium Arsenide (GaAs) material and processes, and the process of attaching the integrated circuit to a circuit device.

Modern electronics equipment often needs efficient power transistors with good radio frequency characteristics. For example, wireless devices typically have a radio and associated circuitry generating a low-level radio frequency signal. This low-level radio frequency signal needs to be amplified for transmission from an antenna system. The use and manufacture of power transistors are well-known, and have advanced to create highly efficient and effective power transistors. For example, power transistors may be made using a GaAs (Gallium Arsenide) material and process. The GaAs material and process have been found to create power transistors with particularly desirable radio frequency characteristics, have high yields, and be cost competitive with other technologies due to their high power densities.

In one example of a GaAs integrated circuit, a GaAs power transistor is formed by first depositing epitaxial layers on the GaAs substrate and then etching to the appropriate layers, followed by depositing a metal contact for terminals of the device. The GaAs power transistor is typically grown on a semi-insulating substrate on which a GaAs contact layer (sub-collector) is deposited. This sub-collector layer is on the contact side of the integrated circuit, and cooperates with a gold contact layer to attach to a pad on a printed circuit board, for example. A GaAs collector region is deposited on top of the sub-collector layer. The base layer is then deposited atop the collector. Next, the emitter layer (a wide bandgap semiconductor) is deposited. On top of this emitter layer, an emitter contacting layer, so that contact resistance can be minimized, is finally deposited. After the growth of the material, the emitter, base and collector contacts are formed by etching to the specific layers and depositing contact metals.

The use of gallium arsenide substrates in the design and construction of integrated circuits has proven to have desirable effects. For example, gallium arsenide substrates have been useful in achieving greater performance in power amplifier integrated circuits, for example. Typically, a gallium arsenide integrated circuit will be used as a component in a larger circuit device or design. In order to be integrated into the circuit design, the gallium arsenide integrated circuit is typically mechanically and electrically coupled to a printed circuit board for the circuit device. In other cases, the gallium arsenide integrated device is mounted to other electronic devices.

A typical gallium arsenide integrated circuit has a gallium arsenide substrate having a set of deposited materials cooperating to implement a particular circuit function. Often, the circuit side is coupled to other device components using wire bond or pin technology. The contact side of the gallium arsenide integrated circuit is typically adhered to a large contact pad on the device's printed circuit board. More particularly, the integrated circuit has a gold contact layer which adheres to the printed circuit board pad using a conductive adhesive. Since the conductive adhesive is intended to flow when under pressure, an amount of the conductive adhesive escapes from beneath the contact as the contact is pressed to the printed circuit board pad. In its final arrangement, a layer of between about 30 to 40 micron of conductive adhesive rests between the gold contact and the printed circuit board pad, and an additional quantity of the conductive adhesive sits as excess in a reflow area around the contact. Accordingly, to accommodate this expected reflow material, the printed circuit board pad is made considerably larger than the actual gold contact on the gallium arsenide integrated circuit.

The gallium arsenide integrated circuit typically has a gallium arsenide substrate with a titanium tungsten (TiW) layer on its contact side. This titanium tungsten (TiW) layer may be approximately 500 angstroms thick, and is useful for improving the application of the gold contact. A layer of gold contact material is deposited on to the titanium tungsten (TiW) at a thickness of about 5 micron. Often, the gallium arsenide substrate has vias which extend into or through the substrate for facilitating electrical flow vertically through the substrate. These vias are also coated with the gold conductive material. However, gold deposits in a non-uniform manner, causing areas of relative thick and relative thin coatings on the walls. This non-uniformity not only has detrimental electrical effects, but also results in using excess gold material, which increases the cost of making the GaAs integrated circuit.

An electroplating process is typically used to deposit the gold material for the gold contact and in the vias. However, the electroplating of gold is typically done at about a 25% duty cycle. This means that for each one hour of time in the electroplating bath, gold is only being deposited for about 15 minutes. In this way, the depositing of gold layer material is a time-consuming and relatively inefficient process. Also, gold is an expensive material, increasing the cost for gallium arsenide integrated circuit products. Finally, gold has a relatively high dissolution rate in solder, and therefore is not able to be soldered to the pad of the device's printed circuit board. Instead, conductive adhesive is typically used to adhere the gold contact to the printed circuit board pad. The use of conductive adhesive requires an additional manufacturing step, and also requires the use of larger pads to accommodate adhesive overflow. However, even with these undesirable features, gold continues to be the standard metal used for contact layer on a gallium arsenide integrated circuit.

Other integrated circuit technologies, such as silicon based technologies, use copper for its contact layer. Copper has superior conductivity, may be applied more uniformly, and is a less costly material. Further, copper has a sufficiently low dissolution rate in solder, so allows the integrated circuit device to be soldered to its printed circuit board pad. However, copper readily oxidizes, which degrades electrical and mechanical characteristics. Accordingly, when used in the silicon process, the copper is applied in thick layers and polished and capped with dielectric materials such as silicon nitride to avoid these oxidation effects.

Although copper has been successfully used in silicon wafer technology, it has not been successfully used in gallium arsenide integrated circuit devices. Copper could readily pass through very thin titanium tungsten (TiW) at high temperatures and diffuse into the gallium arsenide substrate. This diffusion greatly interferes with the electrical characteristics of the gallium arsenide based devices, causing the gallium arsenide integrated circuit to fail or function improperly. Accordingly, the use of copper results in the destruction or nonoperation for gallium arsenide integrated circuits. Further, copper readily oxidizes, and so is difficult to use as a contact material without any protection, to support gallium arsenide integrated circuits.

Due to the desirability of the GaAs integrated circuit technology, there exists a need for a GaAs integrated circuit that consumes less space, is more efficiently manufactured, and uses less costly component materials.

SUMMARY

Briefly, the present invention provides a gallium arsenide (GaAs) integrated circuit device. The GaAs circuit device has a GaAs substrate with a copper contact layer for making electrical ground contact with a pad of a target device. Although copper is known to detrimentally affect GaAs devices, the copper contact layer is isolated from the GaAs substrate using a barrier layer. The barrier layer may be, for example, a layer of nickel vanadium (NiV). This nickel vanadium (NiV) barrier protects the gallium arsenide substrate from the diffusion effects of the copper contact layer. An organic solder preservative may coat the exposed copper to reduce oxidation effects. In some cases, a gold or copper seed layer may be deposited on the GaAs substrate prior to depositing the copper contact layer.

Advantageously, the disclosed gallium arsenide integrated circuit primarily uses copper metal for forming its metal contact to the pad of a target device. Since copper is less expensive than gold, a more cost effect device may be constructed. Also, because the gallium arsenide integrated circuit has a copper contact layer, the integrated circuit may be soldered to the target pad. Soldering provides many desirable benefits. For example, prior gallium arsenide integrated circuits used conductive adhesive to adhere to the printed circuit board, and therefore the pad size had to be over-sized to accommodate substantial overflow of the conductive adhesive. Since the solder has limited or no overflow, the target pad may be sized to match the size of the contact layer, and does not need to accommodate additional overflow space. In this way, the size of the target pad may be made substantially smaller than in previous designs. This space saving may be quite dramatic, for example, resulting in an overall pad size savings of about 40%.

In another benefit of solder, the gallium arsenide integrated circuit may be mounted to the target device in the same manufacturing step as with other solderable electronic parts. In this way, the construction of the target device may avoid the additional step of adhering a gallium arsenide integrated circuit separately from the attachment of other parts. Soldering may also provide additional thermal transfer from the gallium arsenide integrated circuit to the target pad. In this way, the substantial heat generated by a gallium arsenide integrated circuit may be more efficiently and effectively moved from the integrated circuit to heat sink areas of the target device.

BRIEF DESCRIPTION OF THE DRAWINGS

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views. It will also be understood that certain components and details may not appear in the figures to assist in more clearly describing the invention.

DETAILED DESCRIPTION

Figure 1:
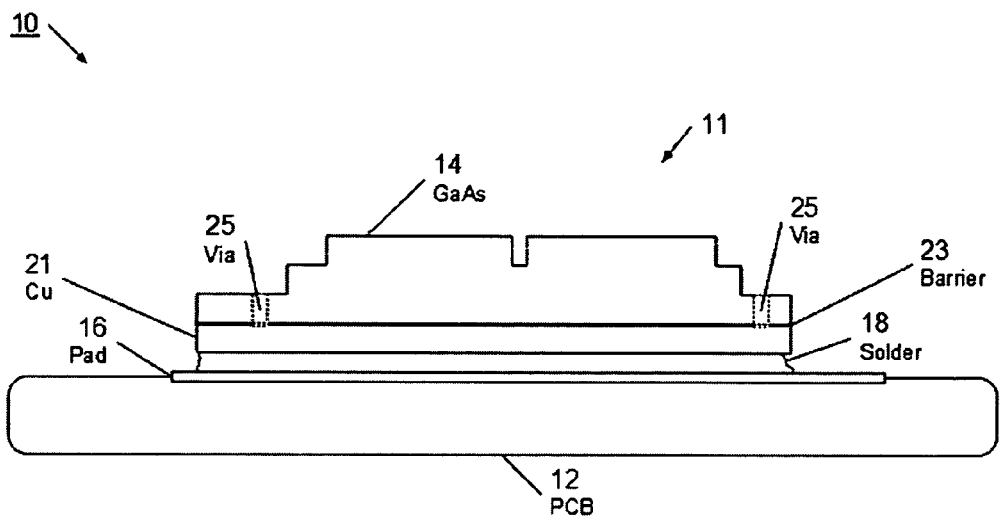
FIG. 1 is a block diagram of a GaAs integrated circuit device in accordance with the present invention.

Referring now to FIG. 1, a GaAs integrated circuit device is illustrated in the form of power amplifier transistor 10. Although the GaAs integrated circuit device is described with reference to power amplifier transistor 10, it will be appreciated that many other useful GaAs integrated circuit devices may be constructed. Power amplifier transistor 10 may be, for example, a power stage for an amplifier system. In one use, power amplifier transistor 10 operates as a final stage amplifier for a radio transmitting device. Although power amplifier transistor 10 will be described with reference to use in a wireless radio device, it will be appreciated that power amplifier transistor 10 may have many other uses. For example, many electronic devices, modules, and circuits have need for high quality power amplification in limited space.

Circuit device 10 has gallium arsenide integrated circuit 11 attached to printed circuit board 12. Other electronic components may be coupled to printed circuit board 12 which cooperate with gallium arsenide integrated circuit 11 to form circuit device 10. In one example, integrated circuit 11 is a gallium arsenide power transistor, and circuit device 10 is part of a radio device. It will be appreciated that other types of gallium arsenide integrated circuits may be used, and many other types of circuit devices may be constructed. Gallium arsenide integrated circuit 11 has gallium arsenide substrate 14 in which an integrated circuit pattern has been constructed. The design and construction of integrated circuit designs is well-known, so will not be described in detail. Gallium arsenide substrate 14 may have vias, such as vias 25 for enabling electrical connections through gallium arsenide substrate 14. Gallium arsenide substrate 14 has copper contact layer 21 for making electrical ground contact with pad 16, which is mounted or arranged on printed circuit board 12. A thin layer of solder 18 is used to securely mechanically attach copper contact layer 21 to printed circuit board pad 16. Solder 18 also is an efficient electrical conductor, so facilitates electrical connection as well. Although copper is known to detrimentally affect gallium arsenide devices, copper contact layer 21 is isolated from gallium arsenide substrate 14 using barrier 23. Barrier 23 may be, for example, a relatively thin layer of nickel vanadium (NiV). This nickel vanadium (NiV) barrier 23 protects gallium arsenide substrate 14 from the diffusion effects of copper contact layer 21. It will be understood that other barrier layer materials may be used.

Advantageously, gallium arsenide integrated circuit 11 primarily uses copper metal for forming its metal contact to printed circuit board 12. However, it will be appreciated that other types of metals, such as gold, may be used for limited purposes, such as for providing a seed layer to facilitate electrical connection between copper contact layer 21 and barrier layer 23. Since gallium arsenide integrated circuit 11 has a copper contact layer, integrated circuit 11 may be advantageously soldered to pad 16. Soldering provides many desirable benefits. For example, prior gallium arsenide integrated circuits used conductive adhesive to adhere to the printed circuit board, and therefore the pad size had to be over-sized to accommodate substantial overflow of the conductive adhesive. Since the solder has limited or no overflow, the pad 16 may be sized to match the size of the contact layer 21, and does not need to accommodate additional overflow space. In this way, the size of pad 16 may be made substantially smaller than in previous designs. This space saving may be quite dramatic, for example, resulting in an overall pad size savings of about 40%.

In another benefit of solder, gallium arsenide integrated circuit 11 may be mounted to printed circuit board 12 in the same manufacturing step as with other solderable electronic parts. In this way, the construction of the printed circuit board may avoid the additional step of adhering a gallium arsenide integrated circuit separately from the attachment of other parts. In a final benefit, solder 18 provides additional thermal transfer from gallium arsenide integrated circuit 11 to the pad 16. In this way, the substantial heat generated by a gallium arsenide integrated circuit may be more efficiently and effectively moved from the integrated circuit to printed circuit board 12. This facilitates the use of additional heat sinking structures on the printed circuit board to enable substantially cooler operation of integrated circuit 11.

The use of a copper contact instead of a gold contact reduces the overall metallization costs for gallium arsenide integrated circuit 11, as well as provides for a more uniform depositing of the contact metal. This more uniform deposition, coupled with the superior conductivity characteristics of copper, enables superior electrical characteristics for the gallium arsenide integrated circuit 11.

Figure 2:
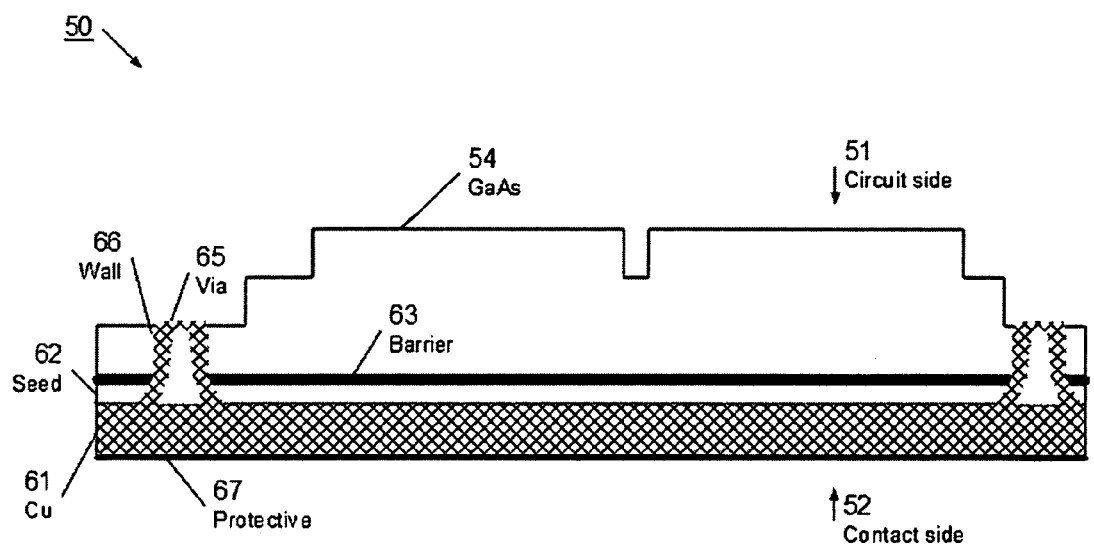
FIG. 2 is a block diagram of a GaAs integrated circuit device in accordance with the present invention.

Referring now to FIG. 2, an enlarged portion of a gallium arsenide integrated circuit is illustrated. Enlarged portion 50 shows gallium arsenide substrate 54 having circuit side 51 and contact side 52. Typically, wire binding or other contact methods may be used to couple other printed circuit board components to circuit side 51, while contact side 52 is used to ground or otherwise connect the gallium arsenide device to the printed circuit board or other circuit component. Gallium arsenide substrate 54 has a relatively thin barrier 63 disposed on its contact side 52. Barrier 63 may be, for example, a nickel vanadium (NiV) barrier at a thickness of approximately 800 angstroms. It will be appreciated that other thicknesses may be used depending upon application specific requirements and the particular materials used. For example, thicknesses in the range of about 500 angstroms to about 2000 angstroms have been found to be effective, although other thickness may be alternatively used. Nickel vanadium (NiV) barrier 63 may be disposed using a physical vapor deposition process, which is commonly referred to as sputtering, or another known process.

Metallic seed layer 62 is disposed on the barrier layer 63. Metal seed layer 62 may be optional in some constructions, but may be useful to facilitate improved electrical or mechanical connection of the contact layer. In one example, metallic seed layer 62 is a gold metal layer at about 700 angstrom thickness. In another example, the metallic seed layer 62 may be a copper layer at approximately 700 angstrom thickness. It will be appreciated that other thicknesses may be used depending upon application specific requirements and the particular materials used. For example, thicknesses in the range of about 500 angstroms to about 2000 angstroms have been found to be effective, although other thickness may be alternatively used. Since copper readily oxidizes, additional care must be taken if copper is used as the seed layer. For example, processing should immediately move to the next step to avoid an oxidation build up, or the process should be performed in an oxygen deprived atmosphere to avoid oxidation. In another example, if the copper has sufficient time to oxidize, then the copper seed layer should be activated, for example using a chemical process, prior to applying the copper contact layer. Due to these additional steps when using copper, a gold layer may be used as a seed layer. Since gold is generally non-oxidizing, the seed layer acts not only to facilitate improved connection, but enables the seeded substrate to wait for further processing without the risk of oxidation. It will be appreciated that other seed layer materials may be used.

Copper contact layer 61 is deposited on the seed layer 62. Copper layer 61 may be applied using an electroplating process, and may be deposited at a thickness of about 6 micron. It will be appreciated that other thicknesses may be used depending on application needs. For example, thicknesses in the range of about 1 micron to about 40 microns have been found to be effective, although other thickness may be alternatively used. Advantageously, copper may be electroplated with a 100% duty cycle for the electroplating process. It will be appreciated that other duty cycles may be used, 50% for example, including processes such as reversed pulse plating and normal pulse plating. In contrast, the gold electroplating process typically operates at only about 25% duty cycle. In this way, the 6 micron copper layer may be deposited much faster than a layer of gold metal. When the copper is electroplated, it will also act to coat or layer the walls 66 of the vias 65. The top opening of via 65 may also be filled to accommodate electrical contact connections. Due to its more uniform layering properties, the copper will deposit a more uniform contact layer within the vias.

After the copper has been electroplated, protective layer 67 is deposited on the copper to reduce oxidation effects. In one example, protective layer 67 is an organic solder preservative (OSP). The OSP may be applied using a bath process, or other known processes may be used. Advantageously, gallium arsenide integrated circuit 50 uses copper as its metal contact layer, thereby enabling material cost savings, as well as enabling the use of the advantageous soldering processes. The OSP may be deposited at a thickness of about 700 angstroms. It will be appreciated that other thicknesses may be used depending upon application specific requirements and the particular materials used. For example, thicknesses in the range of about 100 angstroms to about 900 angstroms have been found to be effective, although other thickness may be alternatively used.

Figure 3:
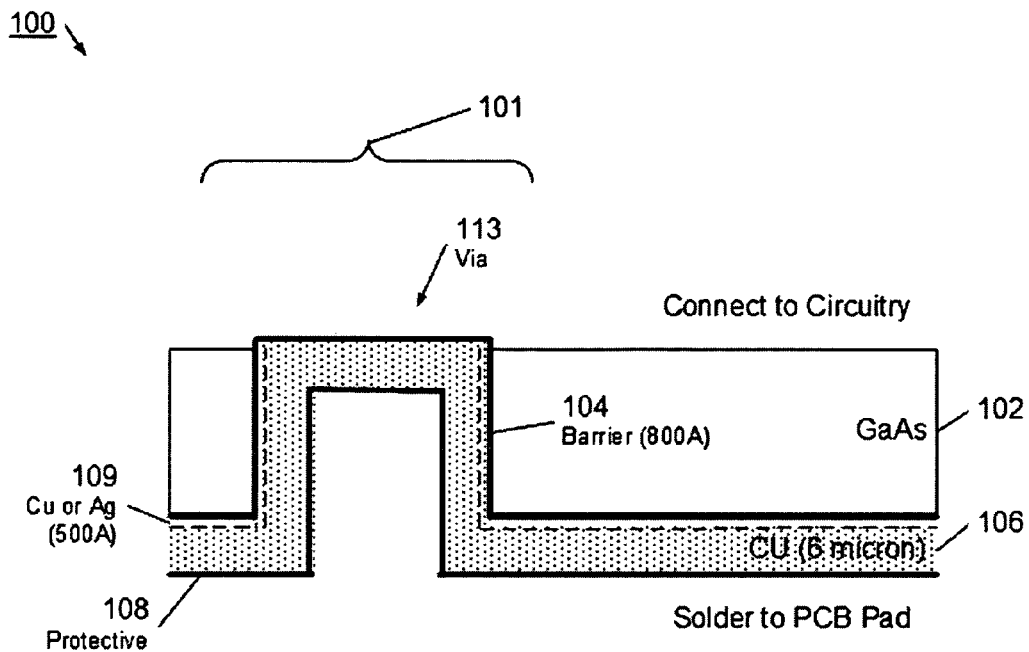
FIG. 3 is a cross sectional diagram of a via section of a GaAs integrated circuit device in accordance with the present invention.

Referring now to FIG. 3, enlarged section 100 of a via is illustrated. Section 100 has via 113 extending through gallium arsenide substrate 102. Barrier layer 104 was sputtered onto the contact side of gallium arsenide substrate 102 to protect the gallium arsenide from diffusion effects from the copper contact. Barrier 104 would be deposited on the contact side of gallium arsenide substrate 102, as well as inside via 113 on the via walls. A seed layer, which may be copper or gold, was deposited over the barrier layer 104. Barrier layer 104 may have been applied relatively thick at about 800 angstroms, while the seed layer may have been somewhat thinner at about 700 angstroms. It will be appreciated that the thickness of the barrier layer may be adjusted according to the thickness and material used for the seed layer. In one example, the barrier layer 104 is selected to be nickel vanadium (NiV).

Copper contact layer 106 is deposited on gallium arsenide substrate 102 using an electroplating process. The copper is deposited at a relatively uniform thickness, such as 6 micron. It will be appreciated that other thicknesses may be used. Depending on the size of the via 113, the copper may simply coat the walls, or may nearly fill the via. To facilitate faster production, a 6 micron coating 106 typically provides sufficient electrical conduction, while leaving a central opening in via 113. After the copper contact layer has been deposited, protective OSP layer 108 is deposited on the exposed copper parts. In one example, the OSP is applied using a bath or wash process. The gallium arsenide integrated circuit may then be attached using a soldering process to a printed circuit board, and may then be wire bonded or otherwise connected to circuitry on the printed circuit board.

Figure 4:
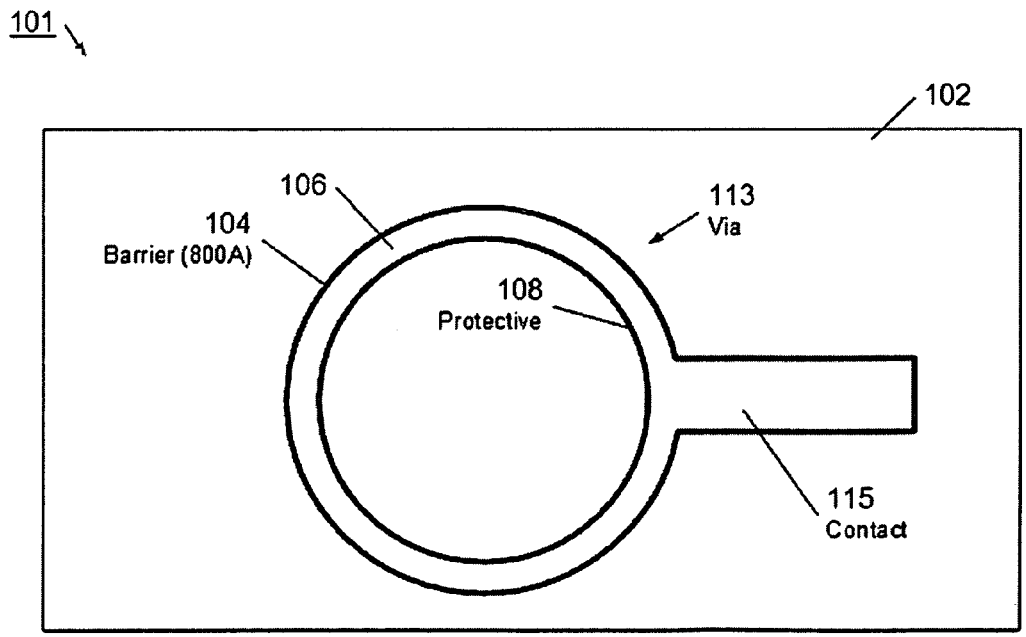
FIG. 4 is a top view diagram of a via section of a GaAs integrated circuit device in accordance with the present invention.

Referring now to FIG. 4, an enlarged top view 101 of a via is illustrated. The via 113 is either a micro-via or through-via in gallium arsenide substrate 102. Barrier layer 104 is disposed between gallium arsenide substrate 102 and copper contact 106. Barrier 104 acts to negate the diffusion effects of copper. Although not illustrated in FIG. 4, it will be understood that copper layer 106 may also have seed layer 109 arranged between contact layer 106 and barrier layer level 104. Protective layer 108 is deposited on contact layer 106 and other exposed copper parts to protect the copper from oxidation. Copper contact 106 also connects to contact 115 on the surface of the gallium arsenide integrated circuit device. Contact 115 may be a trace, or a pad that may be connected to a printed circuit board. It will be appreciated that other contacts may be made to copper contact 106.

Figure 5:
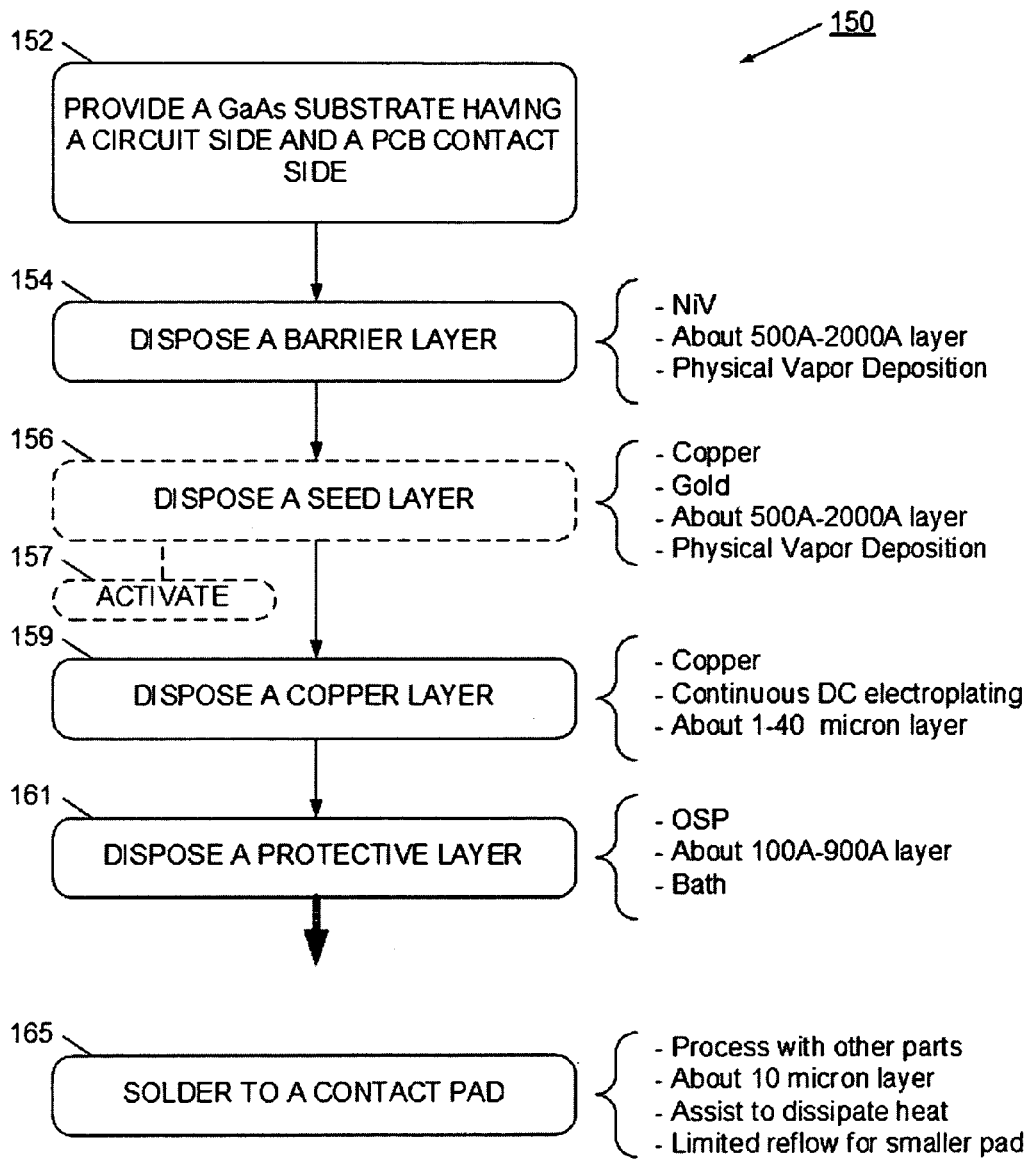
FIG. 5 is a flowchart of a method for making a GaAs integrated circuit device in accordance with the present invention.

Referring now to FIG. 5, a method for making a gallium arsenide integrated circuit device is illustrated. Method 150 has a gallium arsenide substrate which has a circuit side and a printed circuit board contact side as shown in block 152. A barrier layer is deposited on the contact side of the gallium arsenide substrate as shown in block 154. In one example, the barrier layer is a nickel vanadium (NiV) layer disposed at about 800 angstroms thickness. The nickel vanadium (NiV) may be deposited using a physical vapor deposition process, or another known deposition process. The nickel vanadium (NiV) provides an effective diffusion barrier between the gallium arsenide and the copper contact, which will be applied later. Since copper is known to have an undesirable diffusion effect on gallium arsenide, the nickel vanadium (NiV) is deposited at a relatively thick layer. It will be appreciated that the thickness of the layer may be adjusted according to application needs. For example, devices subjected to long-term use may require thicker layers, and the layer may be adjusted according to other material used, for example, in the seed layer.

A seed layer may then be deposited on the barrier layer as shown in block 156. Although a seed layer may not always be necessary, it has been found that a seed layer facilitates better mechanical and electrical connection of the copper contact layer. The metal seed layer may be, for example, either a copper layer or a gold layer, and may be deposited at about a thickness of about 700 angstroms using a physical vapor deposition process. If copper is used as the seed layer, then an activation process 157 may need to be performed at a later time if the copper has been allowed to oxidize. However, if gold is used, no such activation process is necessary as gold is not readily oxidized.

The copper conductive layer is deposited on the seed layer, if present, as shown in block 159. The copper layer is deposited using a continuous DC electroplating process at a thickness of about 6 micron. It will be appreciated other types of processes and thicknesses may be used. Since copper is highly reactive with oxygen, a protective layer is deposited on the copper as shown in block 161. In one example, an OSP layer of about one monolayer is applied as the protective layer. The OSP (organic solder preservative) may be applied using a bath or other wash process.

The gallium arsenide integrated circuit device may then be integrated into the circuit device. Advantageously, the integrated circuit gallium arsenide device may be soldered to the device or printed circuit board as shown in block 165. By using a soldering process, the pad size for the circuit device may be substantially reduced, by avoiding the requirement to leave additional pad space for conductive adhesive overflow. By more accurately matching the size of the pad to the contact layer, substantial pad size savings are enabled. Also, the soldered layer may be relatively thin, for example about 10 microns, in contrast to the relatively thick adhesive conduction layer, which is typically 30-40 microns thick. This enables space savings in the vertical direction as well. Also, since other parts are likely to be soldered for the circuit device, the gallium arsenide integrated circuit may then be attached in the same process as the other parts, thereby enabling more efficient manufacturing. Further, solder assists in dissipating heat from the gallium arsenide integrated circuit device to the pad, where the printed circuit board may then be constructed to pull heat away from the gallium arsenide printed circuit device.

Advantageously, the gallium arsenide integrated circuit device uses copper for effecting its pad contact, which is substantially less costly than using gold metal. Also, the copper is applied in a more uniform layer, facilitating improved electrical characteristics and heat dissipation. Finally, since the copper contact may be soldered, several beneficial results are enabled.

Figure 6:
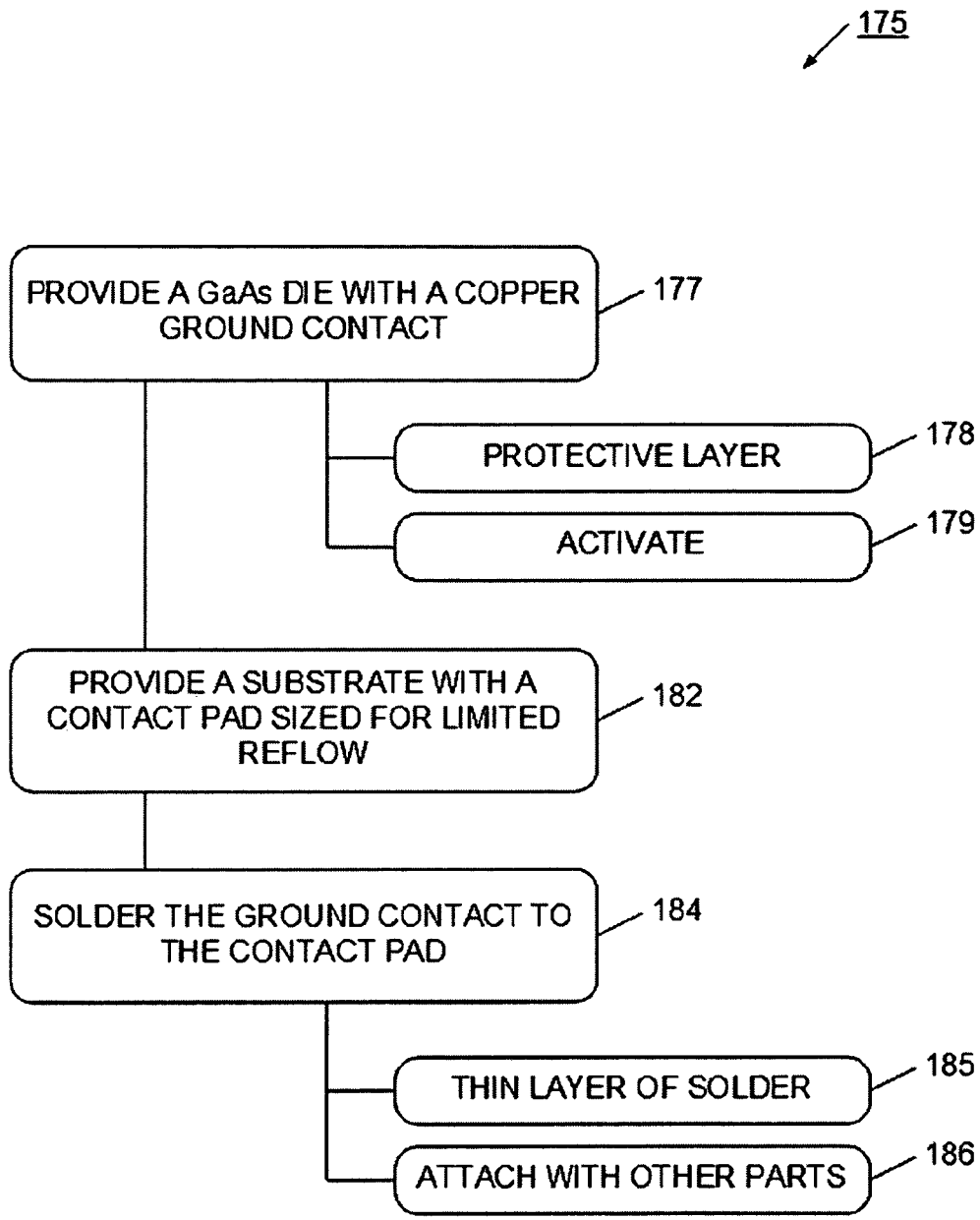
FIG. 6 is a flowchart of a method for using a GaAs integrated circuit device in accordance with the present invention.

Referring now to FIG. 6, a process of using a gallium arsenide integrated circuit is illustrated. Process 175 has a gallium arsenide die or integrated circuit device having a copper contact as shown in block 177. A protective layer 178 may be disposed on the copper to resist oxidation, or the gallium arsenide die may be handled in a way that avoids oxidation. For example, the die may be handled in an oxygen depleted environment, so that oxidation does not occur. In another example, the copper is allowed to oxidize, but then is activated with a chemical or physical process prior to further processing. The gallium arsenide die is integrated into a circuit device as shown in block 182. Advantageously, the circuit device may have a contact pad that is sized substantially similarly to the size of the grounding contact on the gallium arsenide dye. This avoids the need for an oversized pad to allow for adhesive overflow. By allowing the contact pad size to match with the grounding contact size, substantial space may be saved on the circuit device. For example, it has been found that the reduction in pad size results in a pad size savings of around 40%. It will be appreciated that the specific size savings will vary depending upon application specific characteristics.

The gallium arsenide die is then soldered to the contact pad for the circuit device as shown in block 184. A thin layer of solder is used as shown in block 185, for example a 10 micron thick layer. The gallium arsenide die may be attached in the same process step as the soldering attachment of other electronic parts as shown in block 186. In this way, a more efficient manufacturing process is enabled.

Figure 7:
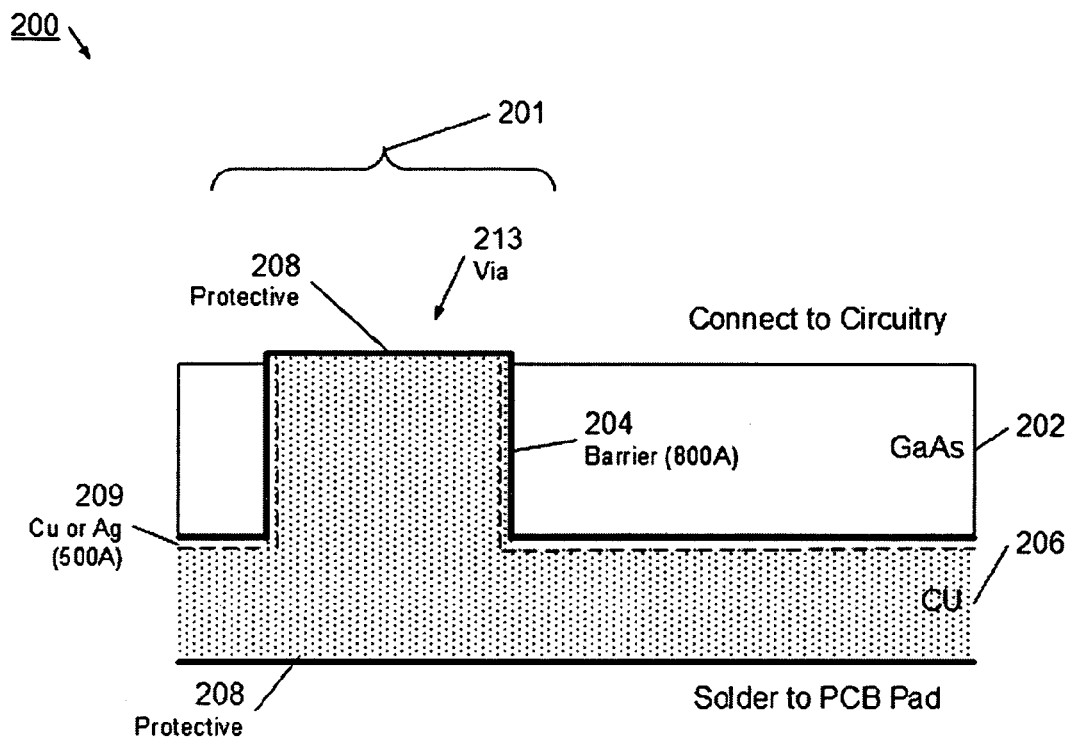
FIG. 7 is a cross sectional diagram of a via section of a GaAs integrated circuit device in accordance with the present invention.

Referring now to FIG. 7, another enlarged via is illustrated. Enlarged section 200 shows a gallium arsenide substrate having via 213. Gallium arsenide substrate 202 has protective barrier 204 and seed layer 209 as previously discussed. Copper layer 206 has been deposited to a greater thickness by increasing the time for the electroplating process. By lengthening the electroplating process, the copper has been deposited to substantially fill via 213. Such a filled via facilitates superior electrical conduction through the gallium arsenide substrate. Protective layer 208 is applied as described earlier.

Figure 8:
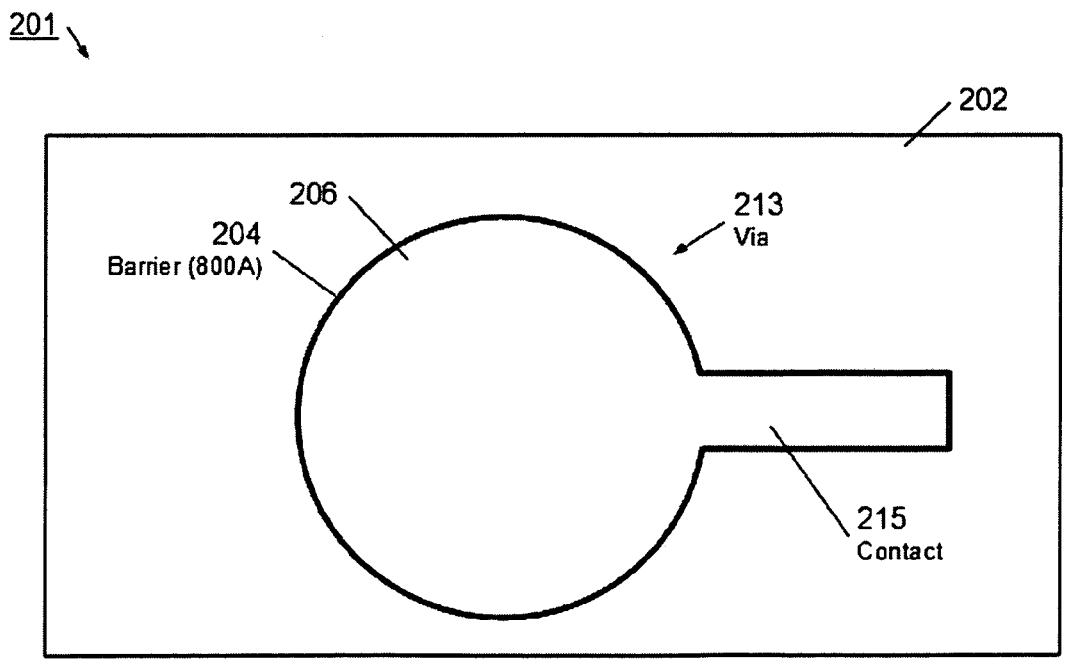
FIG. 8 is a top view diagram of a via section of a GaAs integrated circuit device in accordance with the present invention.

Referring now to FIG. 8, top view 201 of via 213 is illustrated. Via 213 has a solid copper conductive layer 206 and barrier layer 204 which is placed between the copper and the gallium arsenide. The copper contact 206 couples to an electrical contact 215 on the gallium arsenide device.

Figure 9:
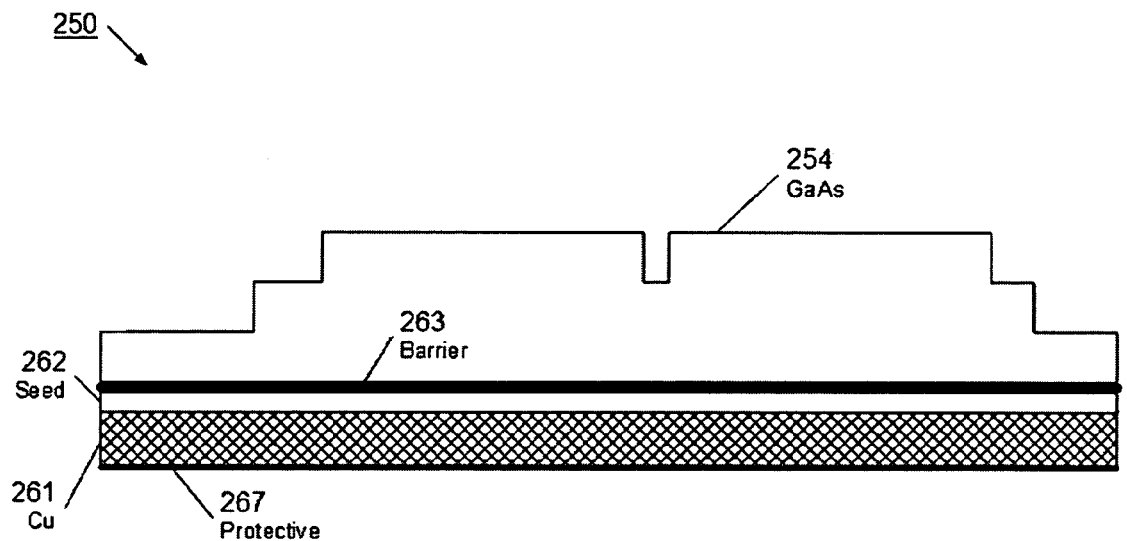
FIG. 9 is a block diagram of a GaAs integrated circuit device in accordance with the present invention.

Referring now to FIG. 9, another gallium arsenide integrated circuit device is illustrated. Some gallium arsenide integrated circuit devices may be constructed without the use of vias. For example, such a gallium arsenide device is described in co-pending patent application Ser. No. 11/372,547, entitled "GaAs Power Transistor", filed Mar. 10, 2006, which is incorporated herein by reference. Such a gallium arsenide device has two transistor contacts on its circuit side, while the third transistor connection is on the contact side. For example, in one construction the base and the emitter are on the circuit side, while the collector is on the contact side. In this example, layer 261 would provide the collector connection to a printed circuit board or other circuit device. In another example, the collector and base may be positioned on the circuit side of the gallium arsenide device, while the emitter may be on the contact side. In this example, the copper layer 261 would provide the contact between the emitter and the printed circuit board or circuit device.

The gallium arsenide device 250 has a gallium arsenide substrate 254 having a nickel vanadium barrier (NiV) 263 and a metallic seed layer 262 as described earlier. A copper contact layer 261 is disposed onto seed layer 262, and an OSP protective layer is disposed on the copper layer to protect against oxidation effects. It will be appreciated that other constructions of gallium arsenide integrated circuit devices may be used.

While particular preferred and alternative embodiments of the present intention have been disclosed, it will be appreciated that many various modifications and extensions of the above described technology may be implemented using the teaching of this invention. All such modifications and extensions are intended to be included within the true spirit and scope of the appended claims.

What is claimed is:

1. A GaAs integrated circuit device, comprising:
a GaAs substrate having a contact side;
a copper contact layer coupled to the contact side of the GaAs substrate, the copper contact layer sized to match a target pad on a surface of a printed circuit board such that the target pad provides limited or no overflow of solder beyond the copper contact layer along a plane parallel to a surface of the copper contact layer adjacent the printed circuit board;
an organic solder preservative (OSP) protective layer disposed on the copper contact layer;
a barrier layer comprising NiV deposited between the copper contact layer and the GaAs substrate; and
a via having a wall and extending through the GaAs substrate to at least the barrier layer, wherein the copper contact layer is coupled to the wall of the via absent intervening layers.

2. The GaAs integrated circuit device according to claim 1, wherein the barrier layer is on the GaAs substrate.

3. The GaAs integrated circuit device according to claim 1, wherein the NiV is about 500 Angstroms to about 2000 Angstroms thick.

4. The GaAs integrated circuit device according to claim 1, wherein a seed layer comprises a metal deposited between the barrier layer and the copper contact layer.

5. The GaAs integrated circuit device according to claim 4, wherein the seed layer comprises copper.

6. The GaAs integrated circuit device according to claim 4, wherein the seed layer comprises gold.

7. The GaAs integrated circuit device according to claim 4, wherein the metal seed layer is about 500 Angstroms to about 2000 Angstroms thick.

8. The GaAs integrated circuit device according to claim 1, wherein the copper contact layer substantially fills the via.

9. The GaAs integrated circuit device according to claim 1, wherein the copper contact layer is about 1 to about 40 micrometers thick.

10. A GaAs power amplifier assembly, comprising:
a GaAs substrate having a contact side;
a NiV barrier layer disposed on the contact side;
a via having a wall and extending through the GaAs substrate to at least the NiV barrier layer;
a copper or gold seed layer disposed on the barrier layer;
a copper contact layer disposed on the seed layer, the copper contact layer coupled to the wall of the via and sized to match a target pad on a surface of a printed circuit board such that when solder is present at the copper contact layer; and
an organic solder preservative (OSP) protective layer disposed on the copper contact layer, wherein the target pad provides limited or no overflow of solder beyond the copper contact layer in a plane defined by a major surface of the printed circuit board.

11. The GaAs power amplifier according to claim 10, wherein the power amplifier is constructed to dissipate heat through the copper contact layer.

12. The GaAs integrated circuit device according to claim 1, wherein the barrier layer is between about 500 Angstroms and 2,000 Angstroms thick.

13. The GaAs integrated circuit device according to claim 12, wherein the barrier layer is about 800 Angstroms thick.

* * * * *